US009773709B2

(12) United States Patent
Cheng et al.

(10) Patent No.: US 9,773,709 B2
(45) Date of Patent: *Sep. 26, 2017

(54) FORMING CMOSFET STRUCTURES WITH DIFFERENT CONTACT LINERS

(71) Applicant: International Business Machines Corporation, Armonk, NY (US)

(72) Inventors: Kangguo Cheng, Schenectady, NY (US); Zuoguang Liu, Schenectady, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/291,467

(22) Filed: Oct. 12, 2016

(65) Prior Publication Data

US 2017/0053837 A1    Feb. 23, 2017

Related U.S. Application Data

(63) Continuation of application No. 14/964,900, filed on Dec. 10, 2015, now Pat. No. 9,502,309, which is a
(Continued)

(51) Int. Cl.
| | |
|---|---|
| *H01L 21/76* | (2006.01) |
| *H01L 21/768* | (2006.01) |
| *H01L 21/8238* | (2006.01) |
| *H01L 23/532* | (2006.01) |
| *H01L 23/535* | (2006.01) |
| *H01L 27/092* | (2006.01) |
| *H01L 23/528* | (2006.01) |
| *H01L 29/161* | (2006.01) |

(Continued)

(52) U.S. Cl.
CPC ........... *H01L 21/823871* (2013.01); *H01L 21/76805* (2013.01); *H01L 21/76843* (2013.01); *H01L 21/76846* (2013.01); *H01L 21/76865* (2013.01); *H01L 21/76895* (2013.01); *H01L 23/485* (2013.01); *H01L 23/5283* (2013.01); *H01L 23/535* (2013.01); *H01L 23/5329* (2013.01); *H01L 23/53209* (2013.01); *H01L 23/53295* (2013.01); *H01L 27/092* (2013.01); *H01L 29/161* (2013.01); *H01L 29/41725* (2013.01); *H01L 21/76897* (2013.01); *H01L 27/0924* (2013.01)

(58) Field of Classification Search
CPC ............ H01L 21/768; H01L 21/76843; H01L 21/823871; H01L 21/8238; H01L 21/76846; H01L 21/76865; H01L 21/76895
USPC ........................................................ 438/656
See application file for complete search history.

(56) References Cited

U.S. PATENT DOCUMENTS 9,502,309 B1 *  11/2016  Cheng  ............ H01L 21/823871

* cited by examiner

*Primary Examiner* — Chuong A Luu
(74) *Attorney, Agent, or Firm* — Cantor Colburn LLP; Vazken Alexanian

(57) ABSTRACT

A method of making a semiconductor device includes forming a first trench contact over a first source/drain region of a first transistor; forming a second trench contact over a second source/drain region of a second transistor; depositing a first liner material within the first trench contact; and depositing a second liner material within the second trench contact; wherein the first liner material and the second liner material include different materials.

20 Claims, 13 Drawing Sheets

Related U.S. Application Data continuation of application No. 14/829,850, filed on Aug. 19, 2015, now Pat. No. 9,520,363.

(51) Int. Cl.
*H01L 29/417* (2006.01)
*H01L 23/485* (2006.01)

US 9,773,709 B2

FORMING CMOSFET STRUCTURES WITH DIFFERENT CONTACT LINERS

DOMESTIC PRIORITY

This application is a continuation of and claims priority from U.S. patent application Ser. No. 14/964,900, filed on Dec. 10, 2015 now U.S. Pat. No. 9,502,309, entitled "FORMING CMOSFET STRUCTURES WITH DIFFERENT CONTACT LINERS," which is a continuation of U.S. patent application Ser. No. 14/829,850, filed on Aug. 19, 2015 now U.S. Pat. No. 9,520,363, entitled "FORMING CMOSFET STRUCTURES WITH DIFFERENT CONTACT LINERS," each application is incorporated herein by reference in its entirety.

BACKGROUND

The present invention relates to metal-oxide-semiconductor field-effect transistors (MOSFET), and more specifically, to reducing contact resistance in MOSFETs.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (NFET) and p-type field effect transistors (PFET) are two types of complementary MOSFETs. The NFET uses electrons as the current carriers and with n-doped source and drain junctions. The PFET uses holes as the current carriers and with p-doped source and drain junctions.

SUMMARY

According to an embodiment of the present invention, a method of making a semiconductor device includes forming a first trench contact over a first source/drain region of a first transistor; forming a second trench contact over a second source/drain region of a second transistor; depositing a first liner material within the first trench contact; and depositing a second liner material within the second trench contact; wherein the first liner material and the second liner material include different materials.

According to another embodiment, a method of making a semiconductor device includes forming a first trench contact over a first source/drain region of a first transistor; forming a second trench contact over a second source/drain region of a second transistor; depositing a first liner material within the first and second trench contacts; filling the first and second trench contacts with a sacrificial material; disposing a first mask over the first trench contact; removing the sacrificial material and the first liner material from the second trench contact that is not covered by the first mask; removing the first mask and depositing a second liner material within the second trench contact and over the first trench contact; disposing a second mask over the second trench contact and removing the second liner material and the sacrificial material from the first trench contact; and removing the second mask and filling the first and second trench contacts with a contact metal; wherein the first liner material and the second liner material comprise different materials.

Yet, according to another embodiment, a semiconductor device includes a first transistor and a second transistor, the first transistor having first source/drain regions on opposing sides of a first gate, and the second transistor having second source/drain regions on opposing sides of a second gate; a first trench contact over the first source/drain regions including a first liner disposed within the first trench contact; and a second trench contact over the second source/drain regions including a second liner disposed within the second trench contact; wherein the first liner and the second liner include different materials.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-5B illustrate an exemplary method of making a semiconductor device according to a first embodiment of the present invention, in which:

FIG. 1 is a cross-sectional side view of an NFET and a PFET formed over a substrate;

FIG. 5B is a cross-sectional side view filling the NFET contact trenches with a contact metal;

FIGS. 6A-6B illustrate an exemplary method of making a semiconductor device according to a second embodiment of the present invention and follow FIG. 4A, in which:

FIG. 6A is a cross-sectional side view after disposing a second mask over the PFET and removing the sacrificial material from the NFET; and FIG. 6B is a cross-sectional side view after removing the second mask, filling both the NFET and PFET contact trenches with a contact metal, and performing a planarization process.

DETAILED DESCRIPTION

Figure 1:
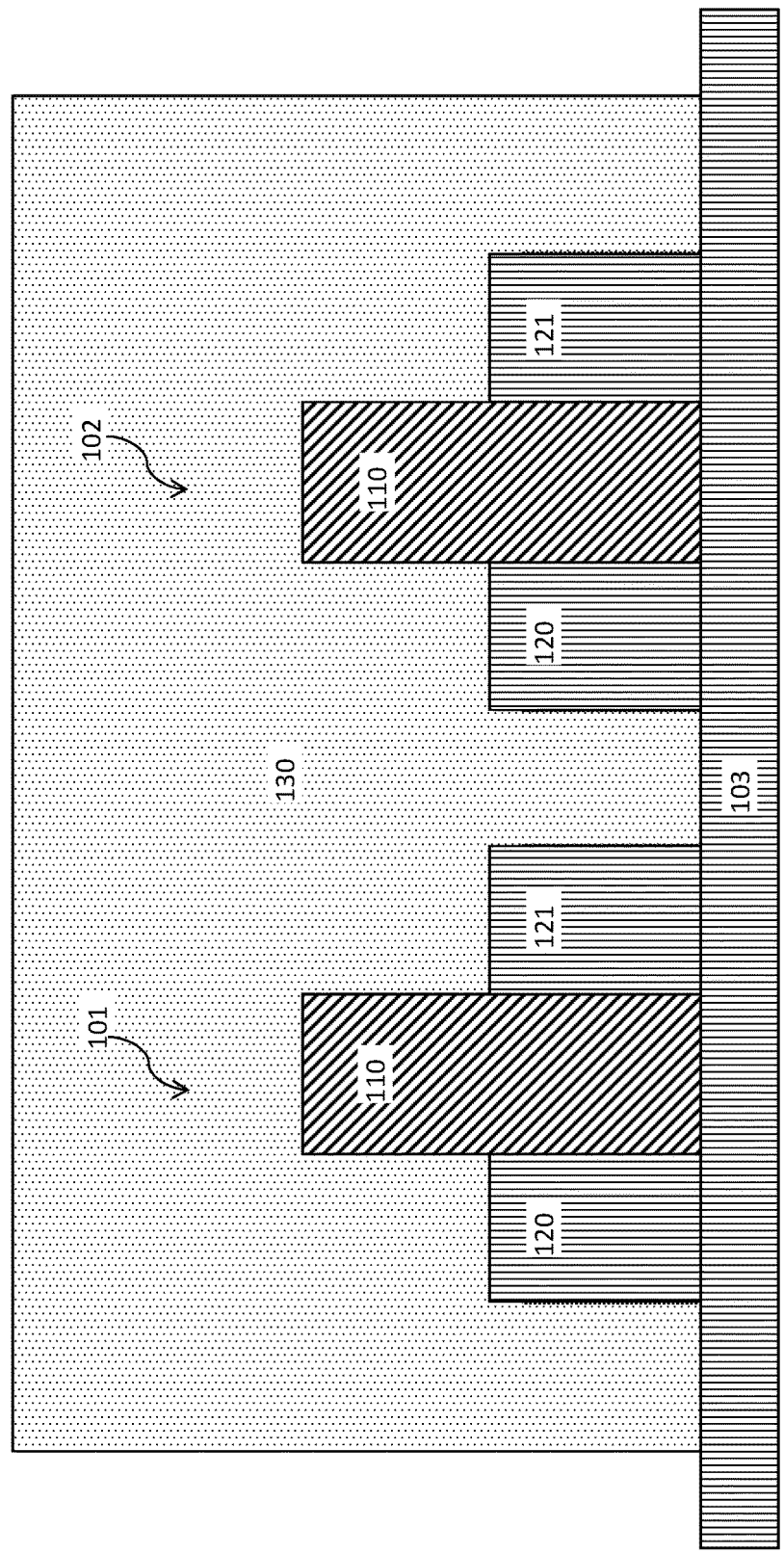

NFETs and PFETs have intrinsically different Schottky barriers when the same metal is used in the source/drain contact. Different contact metals, however, can reduce the contact resistance. Different metal contact liner materials in the different transistors also can minimize vertical metal stack resistance.

Although separate source/drain contact patterning with two masks can be used to form the different metal contacts, this approach has drawbacks. Additional masks may suffer from overlay problems and increase the patterning process complexity. The overlay problems may include, for example, mask misalignment or overlapping mask patterns, which can lead to short circuiting. When multiple metal contact liners are deposited in the contact trench, the contact opening for depositing the low resistance conductor to fill the remaining contact trench is reduced. Consequently, the devices suffer from vertical metal stack resistance penalties.

Accordingly, embodiments of the present invention provide methods of making semiconductor devices with different contact liners. The inventive process flow optimizes the vertical metal contact resistance. Embodiments of the inventive device structure and methods provide reduced contact resistance in semiconductor devices by methods using only one mask, or alternatively, two masks. It is noted that like reference numerals refer to like elements across different embodiments.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

Turning now to the Figures, FIGS. 1-5B illustrate an exemplary method of making a semiconductor device according to a first embodiment of the present invention. FIG. 1 is a cross-sectional side view of an NFET 101 (a first transistor) and a PFET 102 (a second transistor) formed over a substrate 103. Embodiments of the present invention include two types of transistors, a first transistor and a second transistor. The first transistor and second transistor are different transistors.

The substrate 103 is shown for contextual purposes and depends on the type of transistor. For example, when transistors are FinFET or nanowire devices, the substrate 103 includes fins or nanowires. When the transistors are planar devices, the substrate 103 is a semiconductor material with shallow trench isolation (STI) regions between in NFET 101 (first transistor) and PFET 102 (second transistor). The substrate 103 may further include junction isolations.

The NFET 101 and the PFET 102 include a gate stack 110, a source region 120, and a drain region 121. The gate stack 110 includes high-k metal gates formed, for example, by filling a dummy gate opening (not shown) with one or more high-k dielectric materials, one or more work function metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, or any combination thereof. The high-k material may further include dopants such as, for example, lanthanum and aluminum.

The high-k dielectric material layer may be formed by known deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. The type of work function metal(s) depends on the type of transistor and may differ between the NFET 101 and the PFET 102. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and workfunction layer(s) to form the gate stacks 110. Non-limiting examples of suitable conductive metals include aluminum, platinum, gold, tungsten, titanium, or any combination thereof. The conductive metal may be deposited by a known deposition process, for example, CVD, PECVD, PVD, plating, thermal or e-beam evaporation, sputtering, or sputtering.

In some embodiments, a fin (not shown) is patterned in the substrate 103 to form a FinFET device. The gate stack 110 is disposed over and around the fin. In other embodiments, a nanowire or stacked nanowires (not shown) is patterned in the substrate 103 to form a nanowire device.

The gate stack 110 is disposed over and around the fin. Yet, in other embodiments, the devices formed by the disclosed processes are planar devices. In some embodiments, the gate stack may further comprise a dielectric cap layer (not shown) on top of the gate stack 110.

Source regions 120 and drain regions 121 are formed on opposing sides of the gate stacks 110. To form the source and drain regions 120, 121, an epitaxial growth process may be performed to deposit a crystalline layer onto the crystalline substrate 103 beneath. The epitaxial silicon, silicon germanium, and/or carbon doped silicon (Si:C) can be doped during deposition by adding a dopant or impurity to form a silicide. The epitaxial source/drain may be doped with an n-type dopant or a p-type dopant, which depends on the type of transistor. Alternatively, the source/drain regions 120, 121 can be formed by incorporating dopants into the substrate.

An inter-level dielectric (ILD) layer 130 is formed over and around the gate stacks 110 and source and drain regions 120, 121. The ILD layer 130 may be formed from, for example, a low-k dielectric oxide, including but not limited to, spin-on-glass, a flowable oxide, a high density plasma oxide, borophosphosilicate glass (BPSG), or any combination thereof. The ILD layer 130 may further comprise a liner (e.g., silicon nitride) (not shown) that is deposited before an oxide. The ILD layer 130 is deposited by a suitable deposition process, including, but not limited to CVD, PVD, plasma enhanced CVD, atomic layer deposition (ALD), evaporation, chemical solution deposition, or like processes.

Figure 2A:
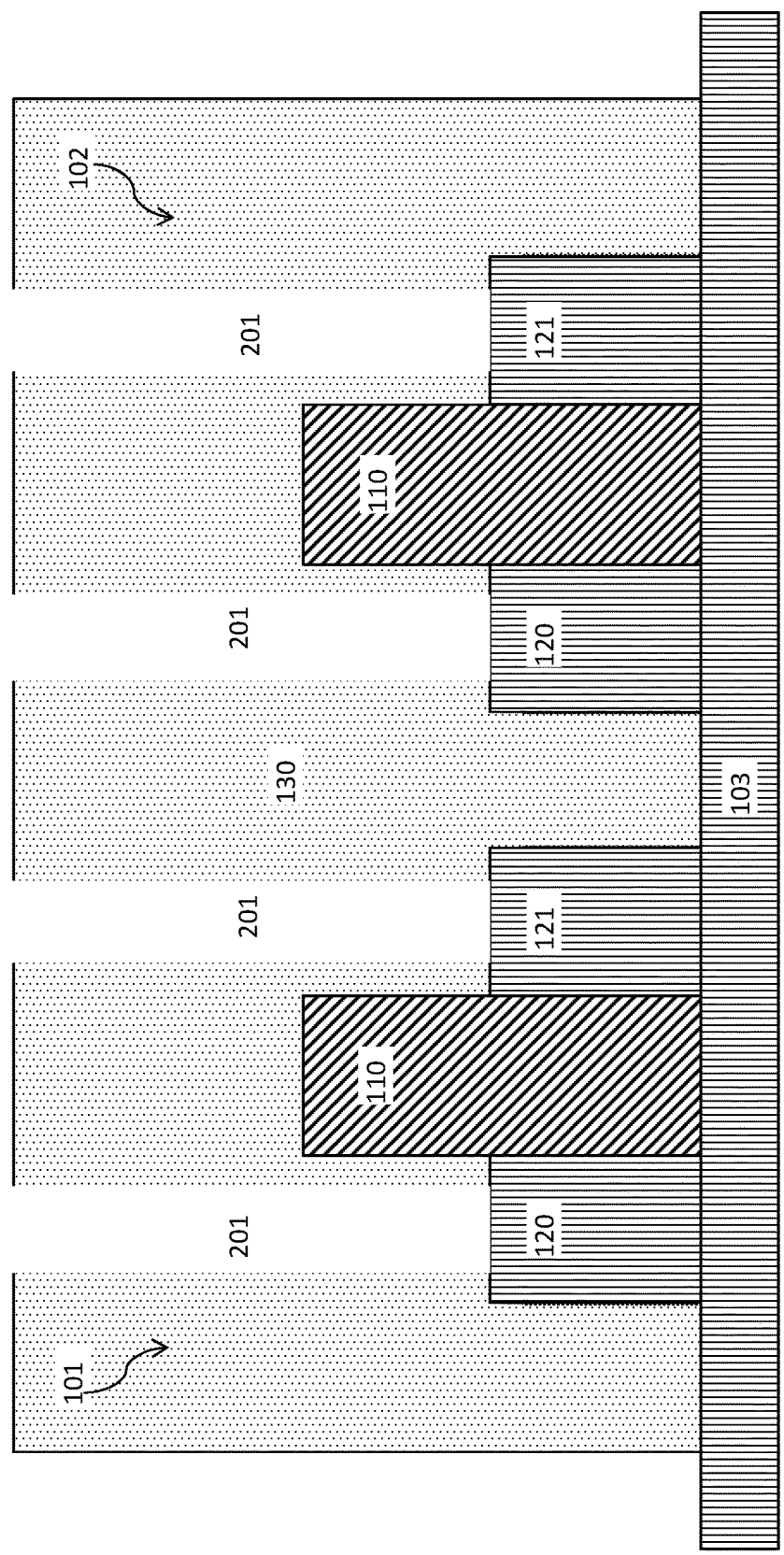
FIG. 2A is a cross-sectional side view after forming contact trenches over source/drain regions of the NFET and PFET.

FIG. 2A is a cross-sectional side view after forming source/drain contact trenches 201 over source and drain regions 120, 121 of both transistors (NFET 101 and PFET 102). The contact trenches 201 are formed by performing an etching process to remove the ILD layer 130 material down to the level of the source and drain regions 120, 121. The contact trenches 201 may be formed by depositing a mask (not shown), for example, a photoresist, over the ILD layer 130. The mask is patterned over the source and drain regions 120, 121. The pattern is transferred into the ILD layer 130 by removing the ILD layer 130 material down to the level of the source/drain regions. The ILD layer 130 material may be removed by a suitable etching process, for example, a reactive ion etch (RIE) process. The mask can be removed after forming the contact trenches 201.

The width of the contact trenches 201 may generally vary and is not intended to be limited. In one aspect, the width of the contact trenches 201 is in a range from about 15 to about 100 nm. In another aspect, the width of the contact trenches 201 is in a range from about 20 to about 50 nm.

Figure 2B:
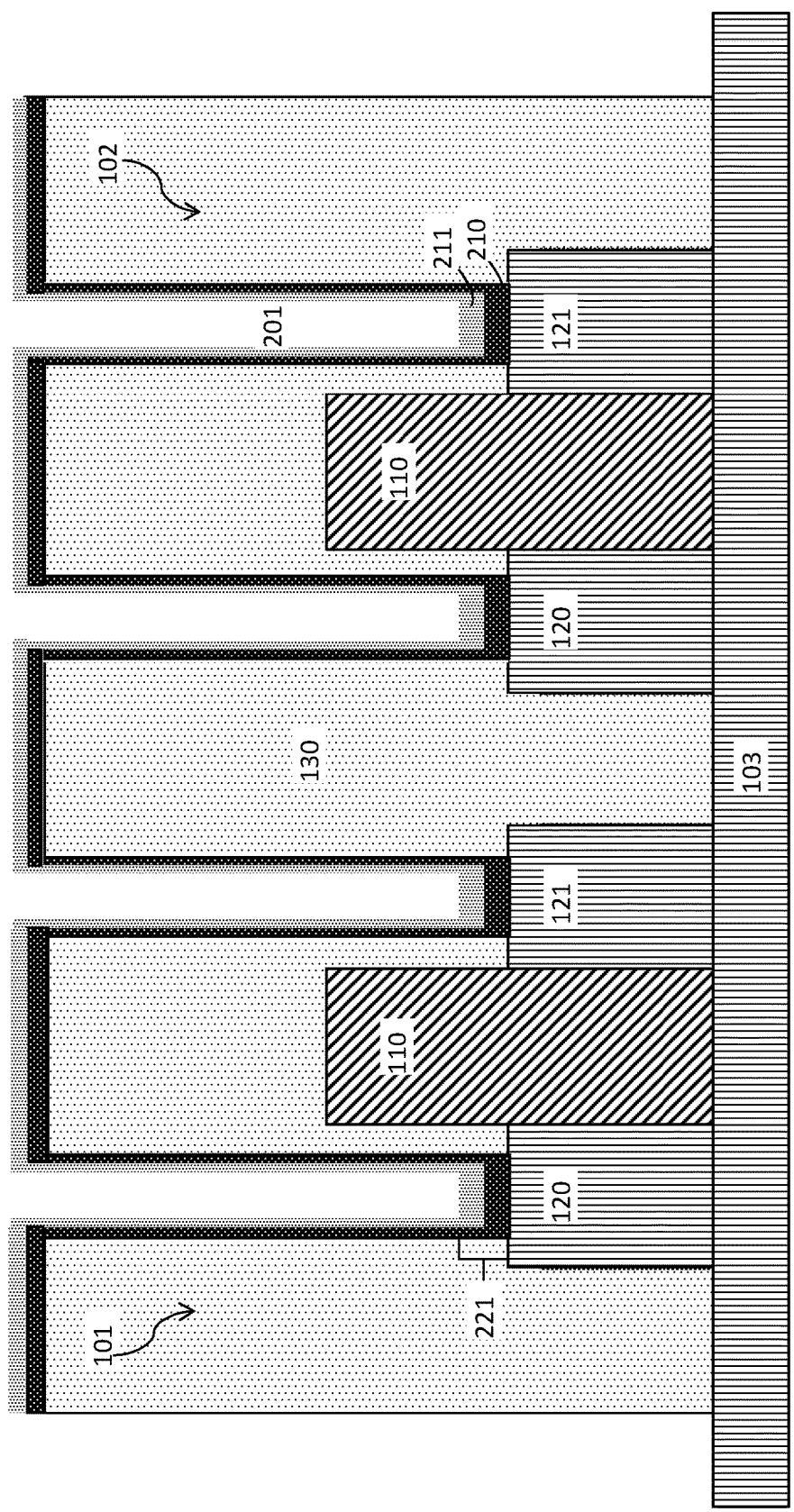
FIG. 2B is a cross-sectional side view after depositing a liner within the contact trenches.

FIG. 2B is a cross-sectional side view after depositing a liner 221 (first liner material) within the contact trenches 201 of both transistors (the NFET 101 and the PFET 102). The liner 221 may be a bilayer liner or a single layer liner (not shown). The liner 221 includes any material(s) that provide a low contact resistance (e.g., a contact resistance lower than $1 \times 10^{-8}$ ohm·cm$^2$) when deposited on the source/drain of one type of transistor (e.g., NFET 101). The liner 221 may not provide the low contact resistance for the other type of transistor (e.g., PFET 102). Non-limiting examples of suitable low contact resistance materials include titanium and titanium nitride. In one embodiment, the liner 221 includes a first layer 210 of titanium and a second layer 211 of titanium nitride. Other non-limiting examples of suitable materials for the liner 221 include cobalt, titanium, cobalt titanium, nickel, platinum, nickel platinum titanium, or any combination thereof. The one or more layers/films making up the liner 221 may be formed by a chemical vapor deposition process (CVD), atomic layer deposition (ALD), or other suitable process. When the liner 221 includes more than one layer or film, the layers may be formed in separate reaction chambers or in an integrated reaction chamber.

The total thickness of the liner 221 (first liner) may generally vary and is not intended to be limited. In one aspect, the total thickness of the liner 221 is in a range from about 2 to about 15 nm. In another aspect, the total thickness of the liner 221 is in a range from about 3 to about 6 nm.

Figure 2C:
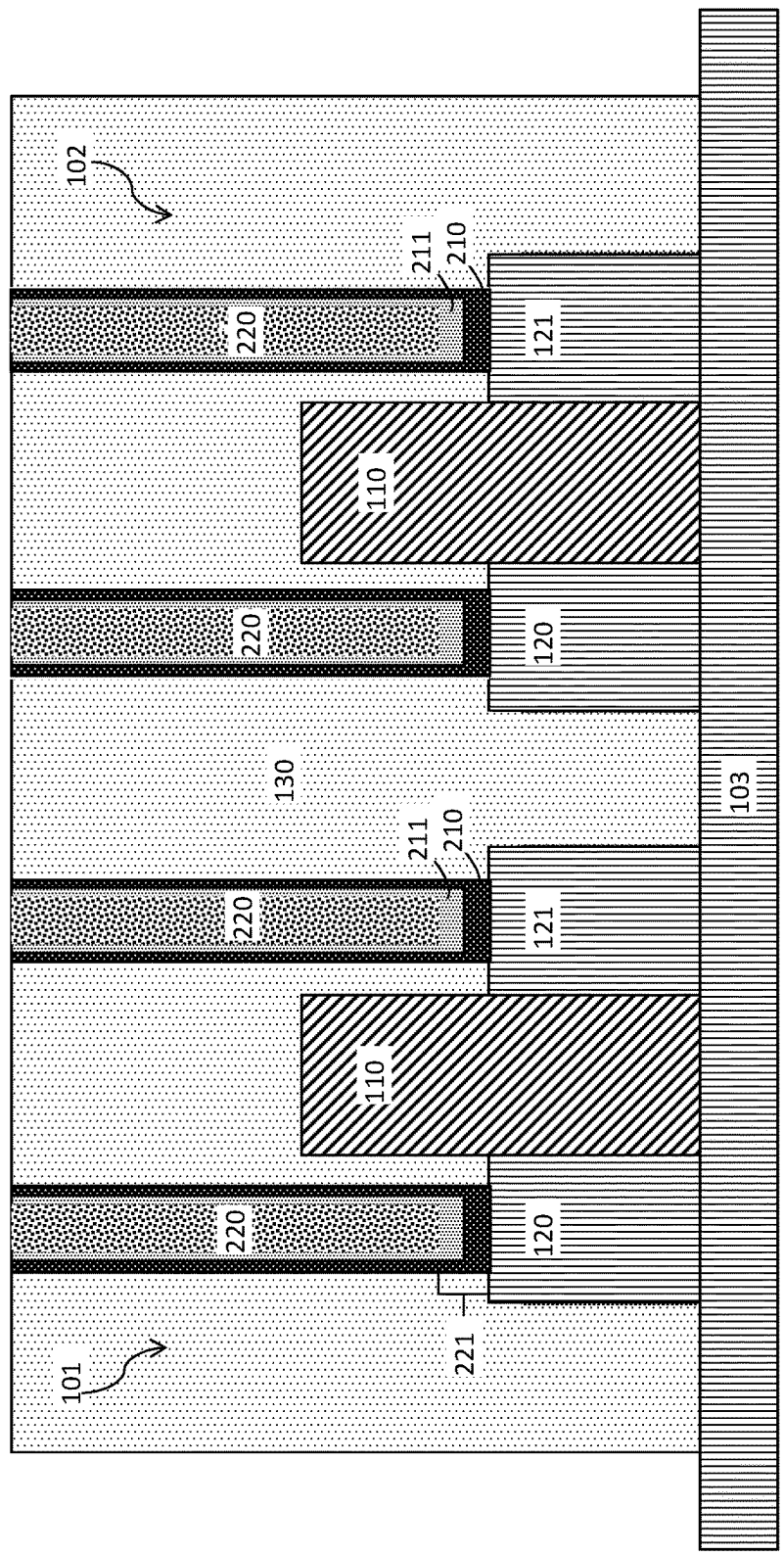
FIG. 2C is a cross-sectional side view after depositing a sacrificial material to fill the contact trenches.

FIG. 2C is a cross-sectional side view after depositing a sacrificial material 220 to fill the contact trenches 201 in both transistors. The sacrificial material 220 may be, for example, amorphous conformal carbon. A planarization process, for example, chemical mechanical planarization (CMP), is performed to polish the surface of the ILD layer 130 and remove the residual liner 220 material and the sacrificial material 220. The sacrificial material 220 is deposited by a suitable deposition process, for example, CVD, or other suitable process.

Figure 3A:
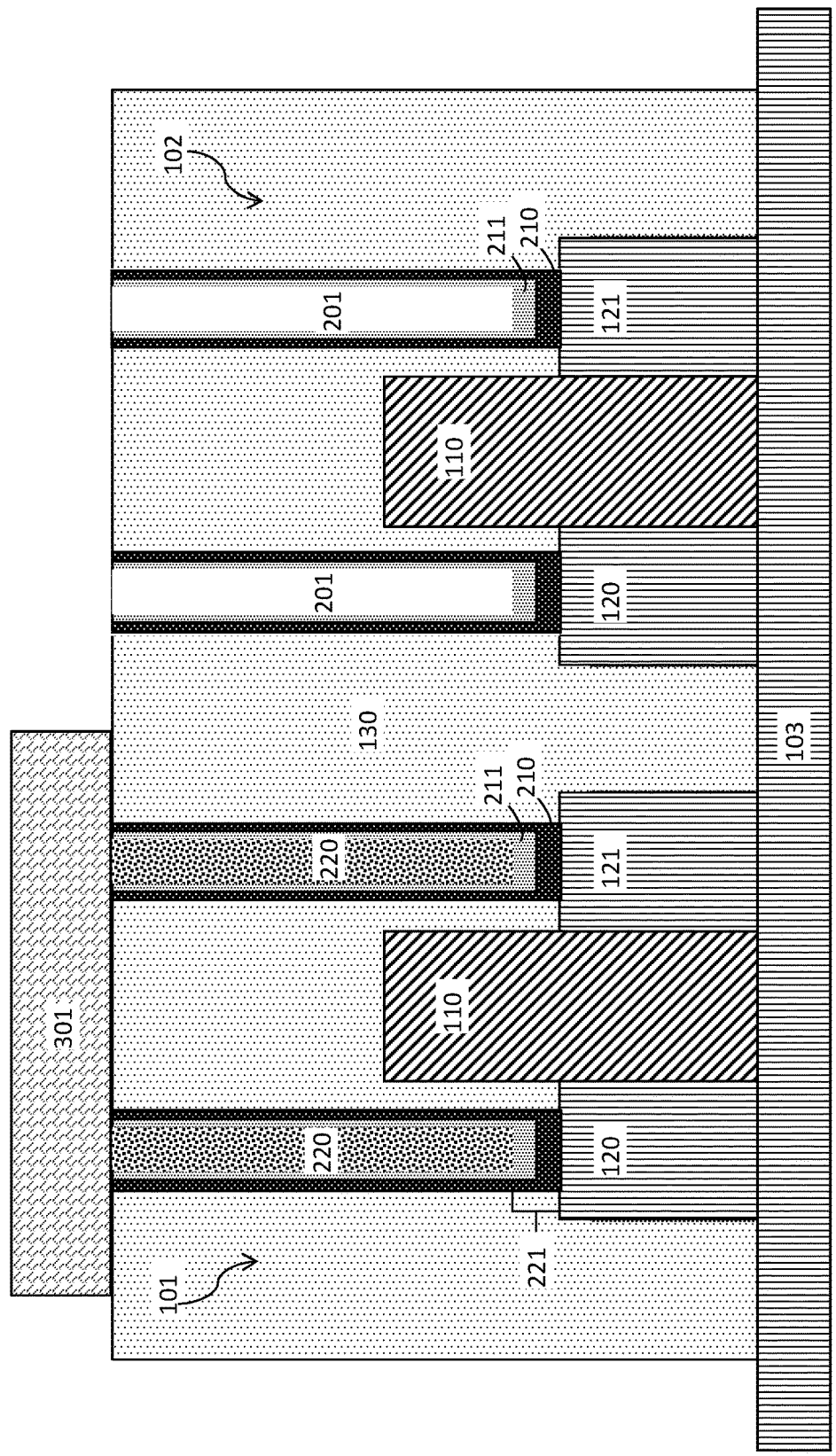
FIG. 3A is a cross-sectional side view after disposing a mask over the NFET and removing sacrificial material from the PFET contact trenches.

FIG. 3A is a cross-sectional side view after disposing a mask 301 over the NFET 101 region (first transistor) and removing the sacrificial material 220 from the PFET contact trenches 201. In other embodiments, the mask 301 is disposed over the PFET 102 region (second transistor). The mask 301 is the only mask used in the first embodiment shown in FIGS. 1-5B. The mask 301 covers at least the contact trenches 201 over the source and drain regions 120, 121 of the NFET 101 (first transistor). The mask 301 may include, for example, a hard mask material or a photolithography stack. Non-limiting examples of suitable materials for the hard mask materials include silicon oxide, silicon nitride, or any combination thereof.

The sacrificial material 220 may be removed from the PFET 102 (second transistor) contact trenches 201 by a suitable stripping process. For example, the sacrificial material 220 may be removed by a dry etching process, for example, ashing. Ashing is performed using a suitable reaction gas, for example, $O_2$, $N_2$, $H_2/N_2$, $O_3$, $CF_4$, or any combination thereof. The dry etching process may be combined with a wet etching process. The wet etching process may be performed, for example, with a wet etchant, such as sulfuric acid and hydrogen peroxide. The sacrificial material 220 removal process employed depends on the material forming the liner 221.

Figure 3B:
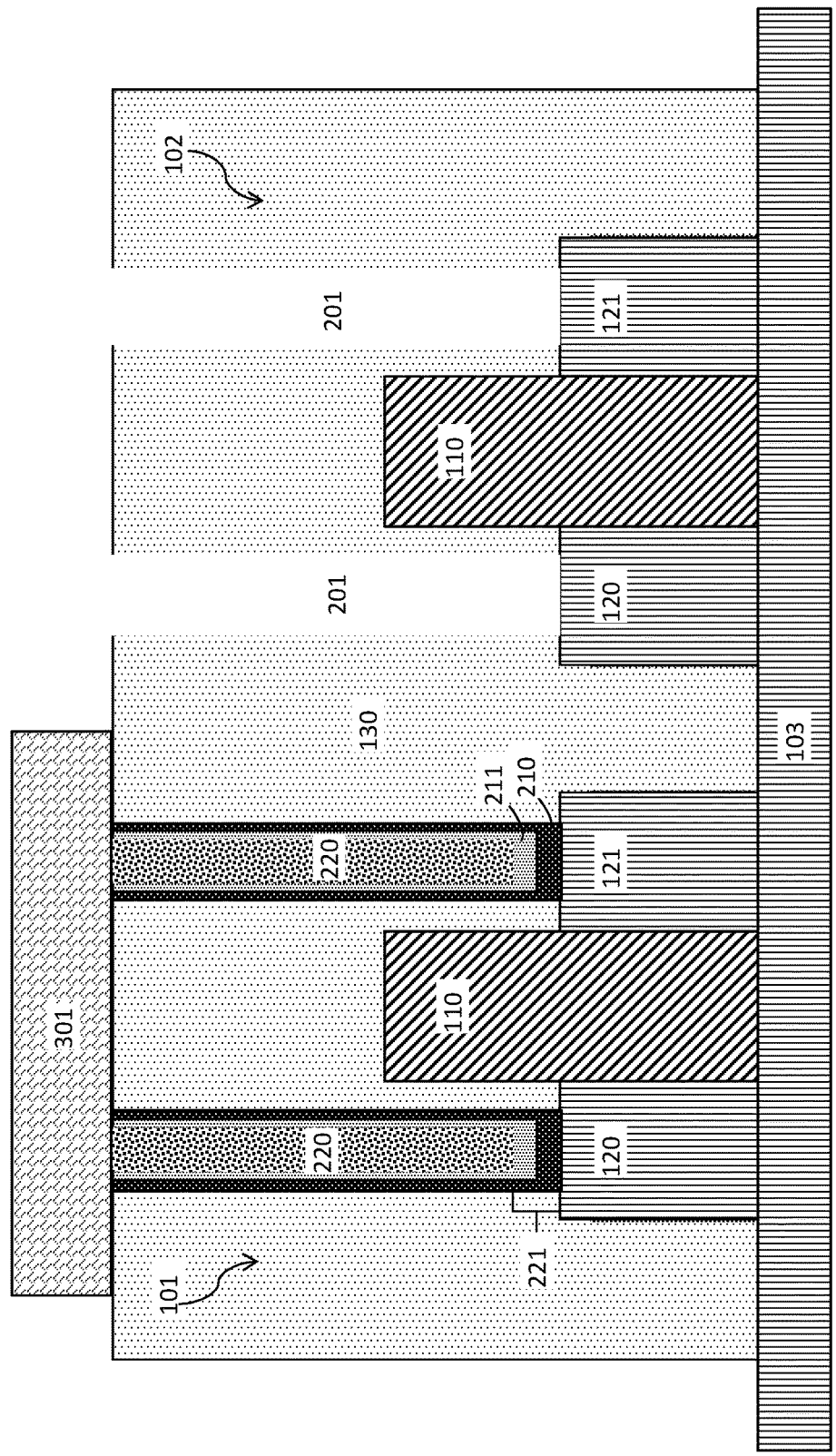
FIG. 3B is a cross-sectional side view after removing the liner from the PFET contact trenches.

FIG. 3B is a cross-sectional side view after removing the liner 221 from the PFET 102 (second transistor) contact trenches 201. The liner 221 may be stripped away using any suitable controlled etching process. Controlled etching may be accomplished, for example, using a heated solution of $NH_4OH/H_2O_2/H_2O$, also known as an "SC1" solution.

Figure 3C:
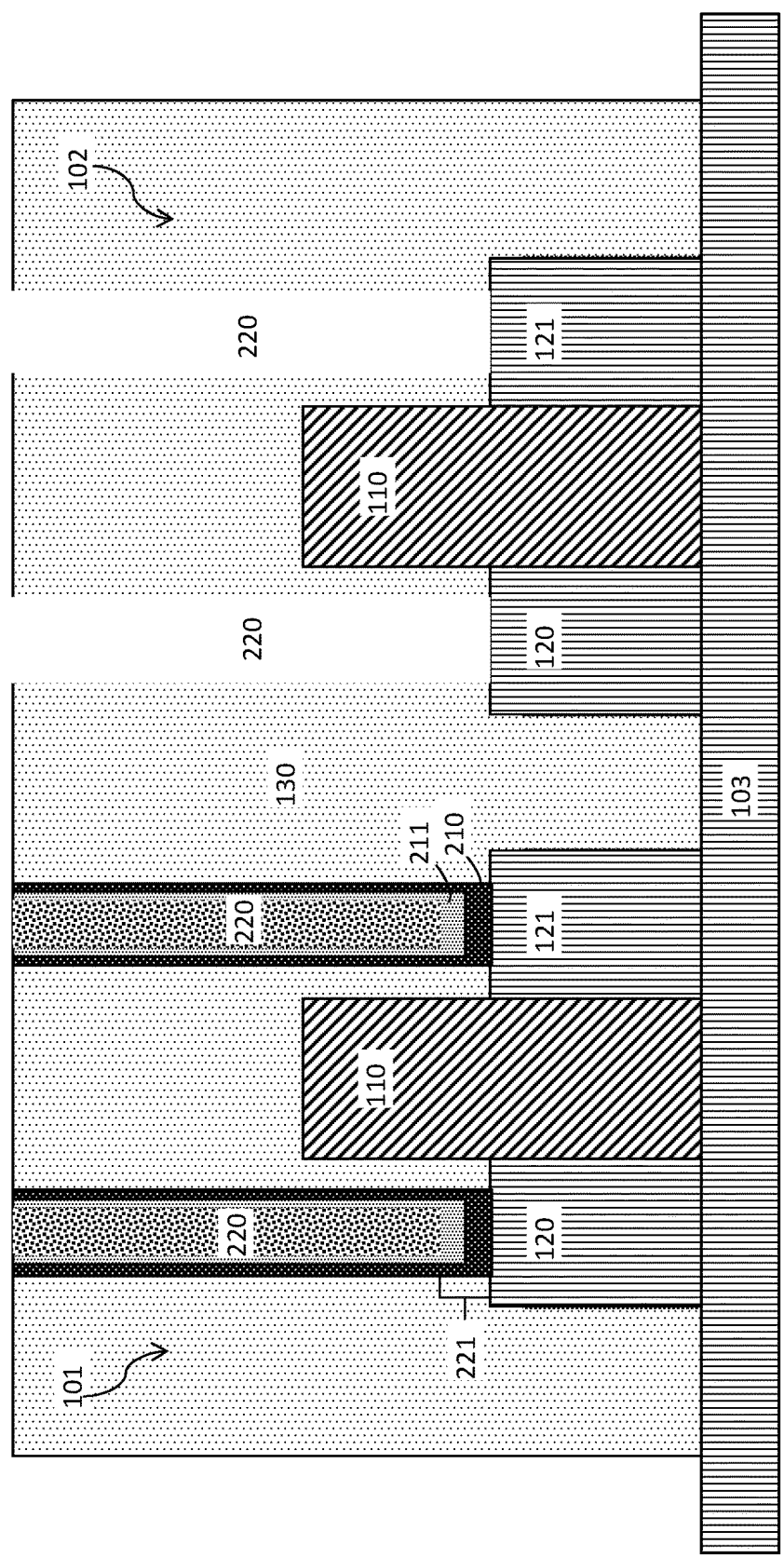
FIG. 3C is a cross-sectional side view after removing the mask over the NFET.

FIG. 3C is a cross-sectional side view after removing the mask 301 over the NFET 101 (first transistor). The mask 301 may be removed, for example, by ashing. Other methods of stripping the mask 301 may be used.

Figure 4A:
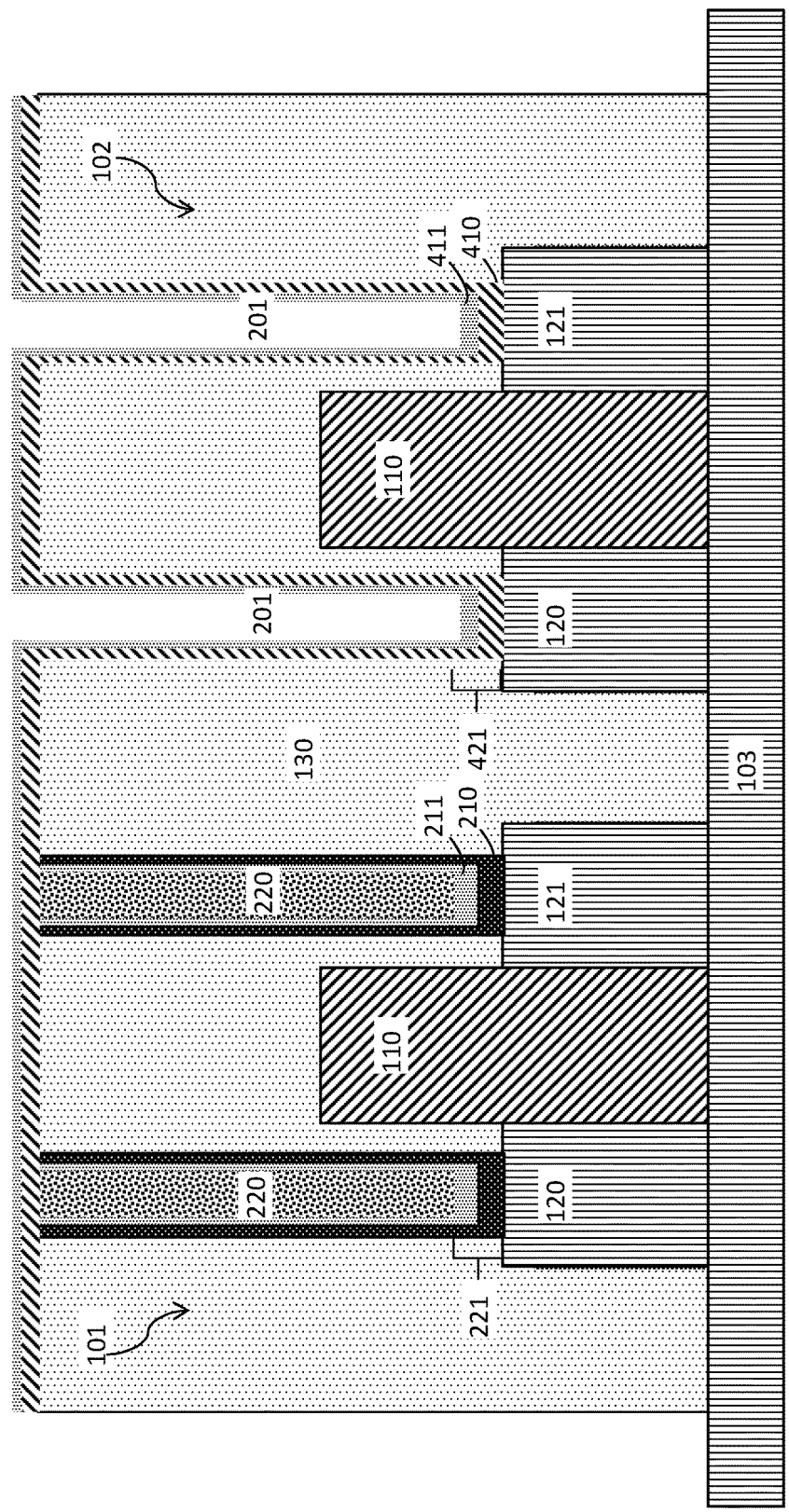
FIG. 4A is a cross-sectional side view after depositing another liner material within the PFET contact trenches.

FIG. 4A is a cross-sectional side view after depositing another liner 421 material (second liner material) within the PFET 102 (second transistor) contact trenches 201. The liner 421 may include one or more layers and may be a bilayer liner as shown. The liner 421 also may include a single layer (not shown). The liner 421 may include, for example, a bilayer of a first layer 410 and a second layer 411. Suitable materials for the first layer 410 include, but are not limited to, cobalt, titanium, cobalt titanium, nickel, platinum, nickel platinum titanium, or any combination thereof. Suitable materials for the second layer 411 include, but are not limited to titanium nitride or another metal nitride. Any of the above processes described above for the liner 221 may be used to form the liner 421. The materials forming the liner 421 of the PFET 102 (second transistor) are different from the materials forming liner 221 of the NFET 101 (first transistor). Any material(s) that provide low contact resistance for the transistor 102 may be used to form the liner 421.

The total thickness of the liner 421 may generally vary and is not intended to be limited. In one aspect, the total thickness of the liner 421 is in a range from about 2 to about 15 nm. In another aspect, the total thickness of the liner 421 is in a range from about 3 to about 6 nm.

Figure 4B:
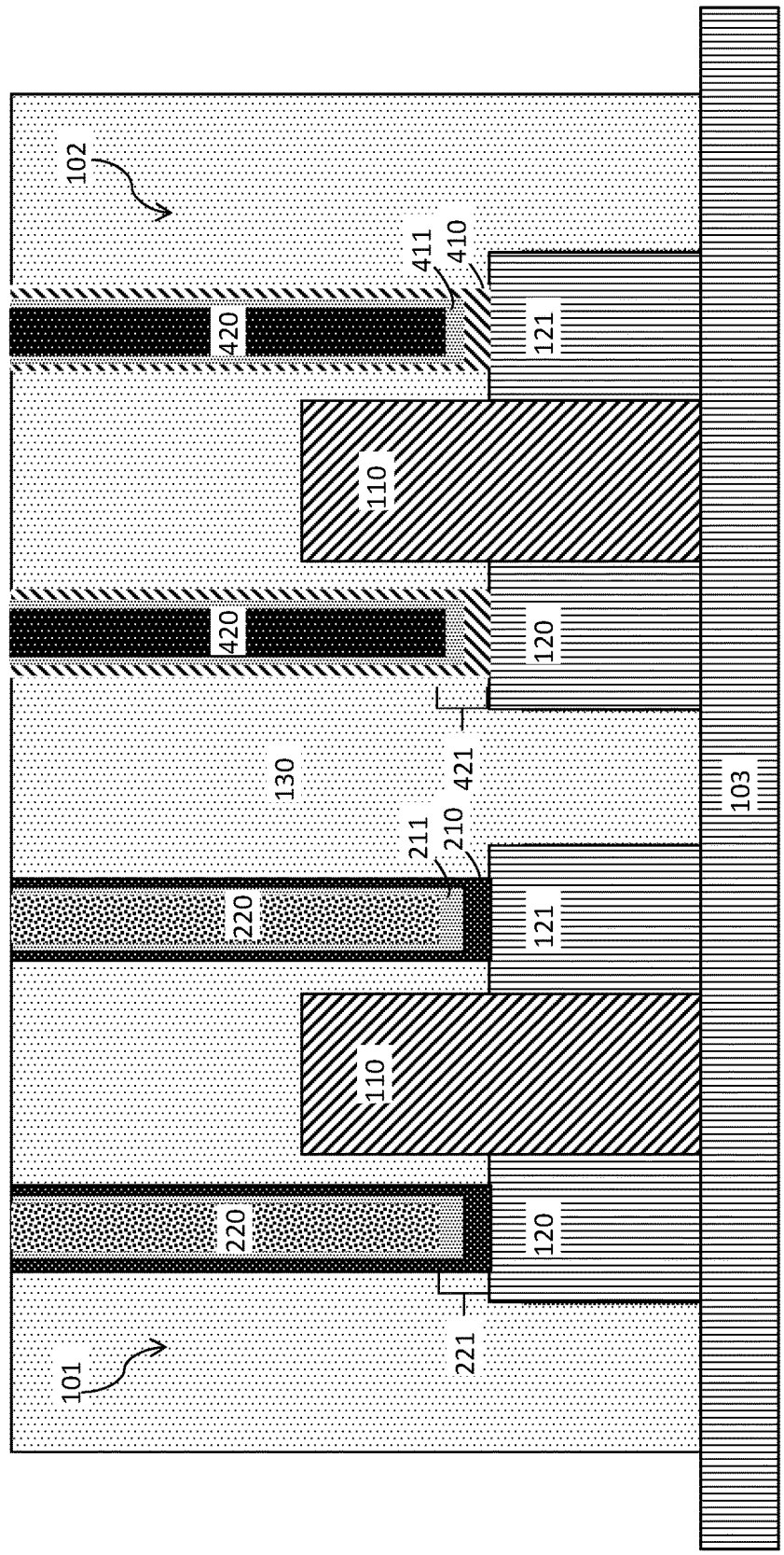
FIG. 4B is a cross-sectional side view after filling the PFET contact trenches with a contact metal and performing a planarization process.

FIG. 4B is a cross-sectional side view after filling the PFET 102 (second transistor) contact trenches 201 with a contact metal 420 and performing a planarization process. Non-limiting examples of suitable contact metals 420 include aluminum, platinum, gold, tungsten, titanium, or any combination thereof. The contact metal 420 may be deposited by a known deposition process, for example, CVD, PECVD, PVD, plating, thermal or e-beam evaporation, and sputtering. A planarization process, for example, chemical mechanical planarization (CMP), is performed to remove the contact metal 420 and the second contact liner 410 and 411 above the surface of the ILD layer 130.

Figure 5A:
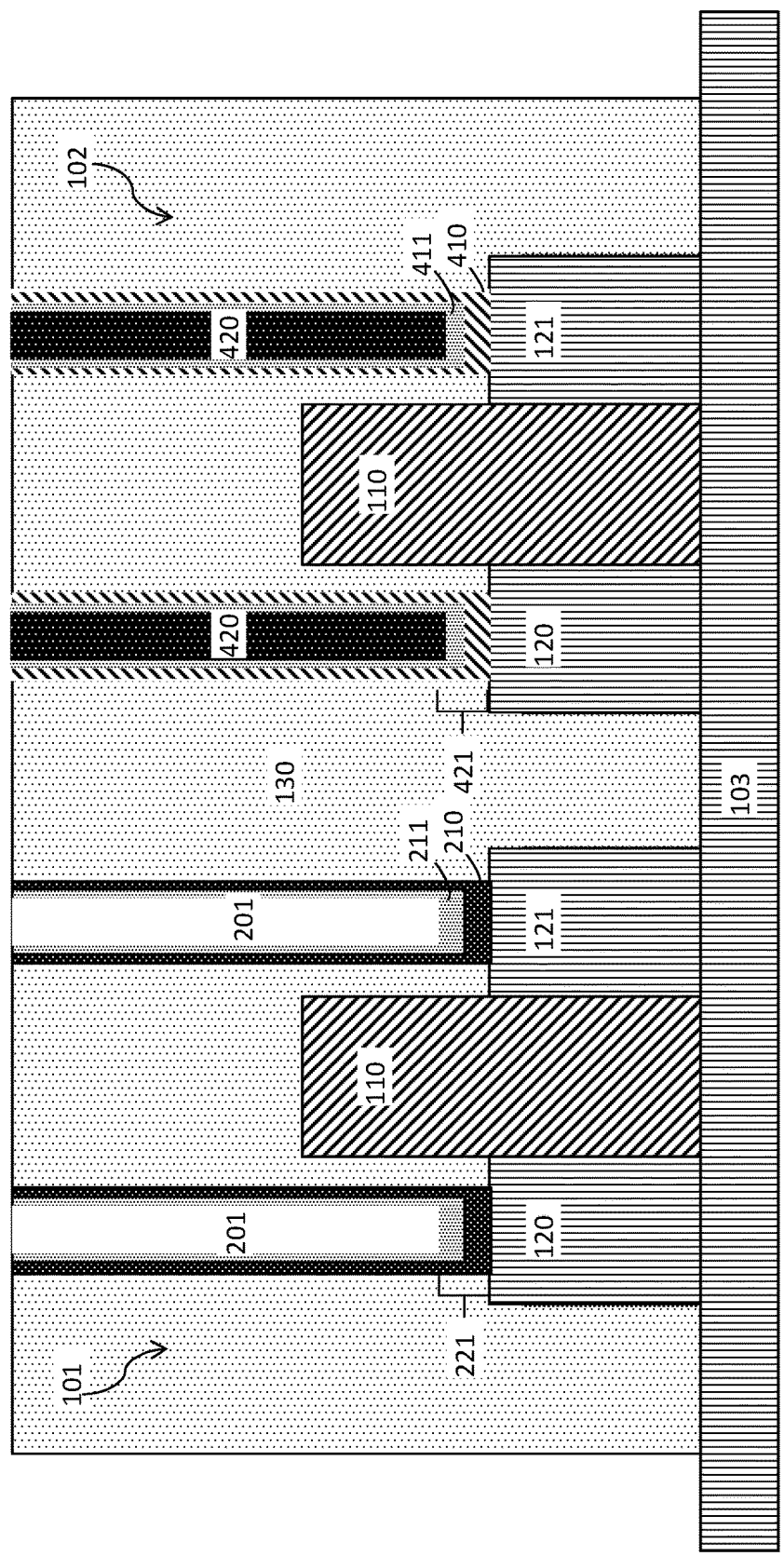
FIG. 5A is a cross-sectional side view after removing the sacrificial material from the NFET contact trenches.

FIG. 5A is a cross-sectional side view after removing the sacrificial material 220 from the NFET 101 (first transistor) contact trenches 201. The removal of the sacrificial material 220 is performed in a process that is selective to the contact metal 420 and the ILD. Because the PFET 102 contact trenches 201 are already filled with the contact metal 420, no mask is needed to fill the NFET 101 contact trenches 201 with a different contact metal.

The sacrificial material 220 may be removed from the NFET 101 contact trenches 201 by a suitable stripping process. For example, the sacrificial material 220 may be removed by a dry etching process, for example, ashing. Ashing is performed using a suitable reaction gas, for example, $O_2$, $N_2$, $H_2/N_2$, $O_3$, $CF_4$, or any combination thereof. The dry etching may be combined with a wet etching process. The wet etching process may be performed, for example, with a suitable wet etchant such as sulfuric acid and hydrogen peroxide. The sacrificial material 220 removal process employed depends on the material forming the liner 221.

Figure 5B:
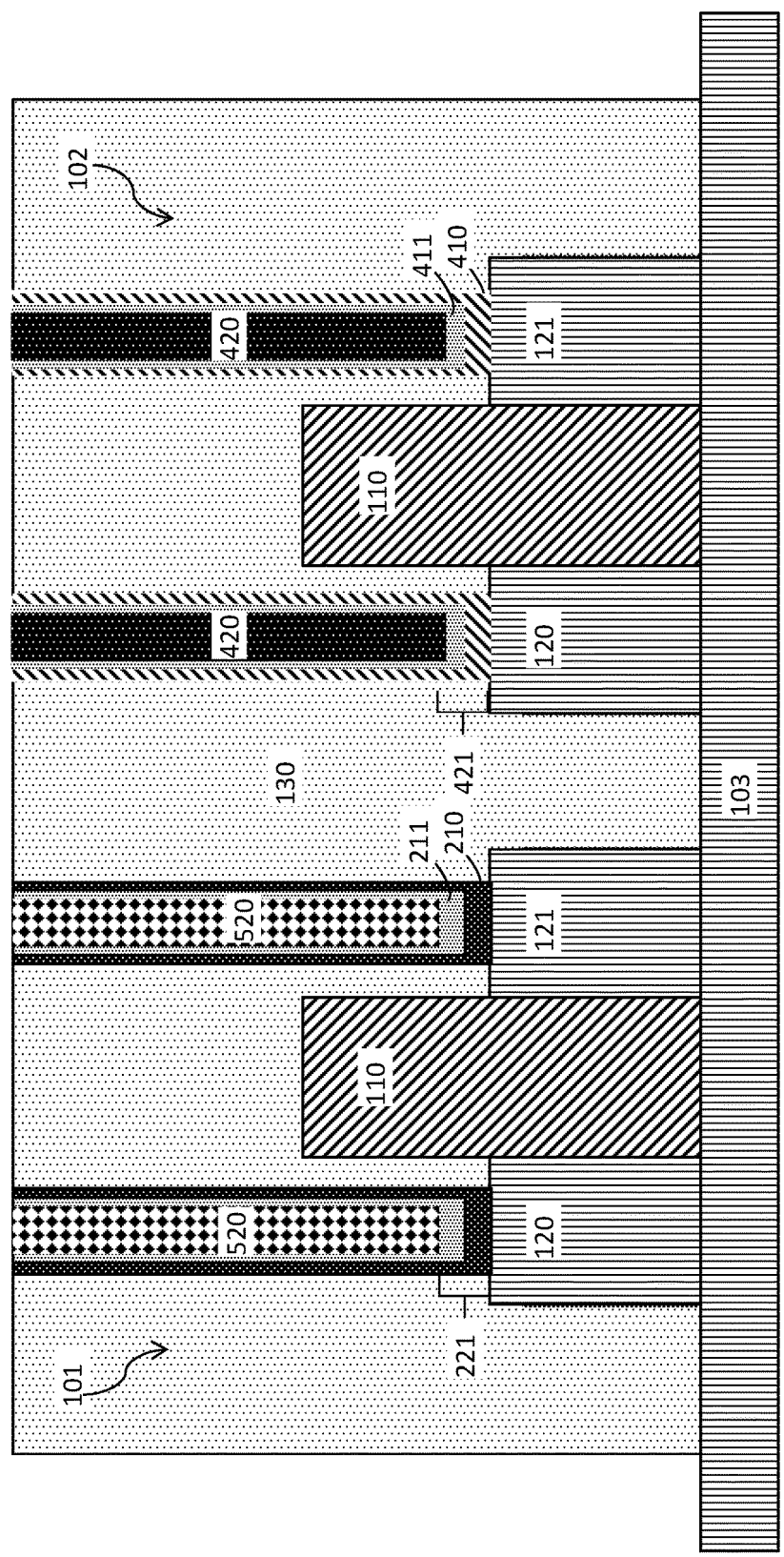

FIG. 5B is a cross-sectional side view filling the NFET 101 (first transistor) contact trenches 201 with a contact metal 520. Non-limiting examples of suitable contact metals 520 include aluminum, platinum, gold, tungsten, titanium, or any combination thereof. The contact metal 520 may be deposited by a known deposition process, for example, CVD, PECVD, PVD, plating, thermal or e-beam evaporation, and sputtering. A planarization process, for example, CMP, is performed to remove the contact metal from the surface of the ILD layer 130. The contact metal 520 of the NFET 101 (first transistor) may be the same or different from the contact metal 420 in the PFET 102 (second transistor).

Figure 6A:
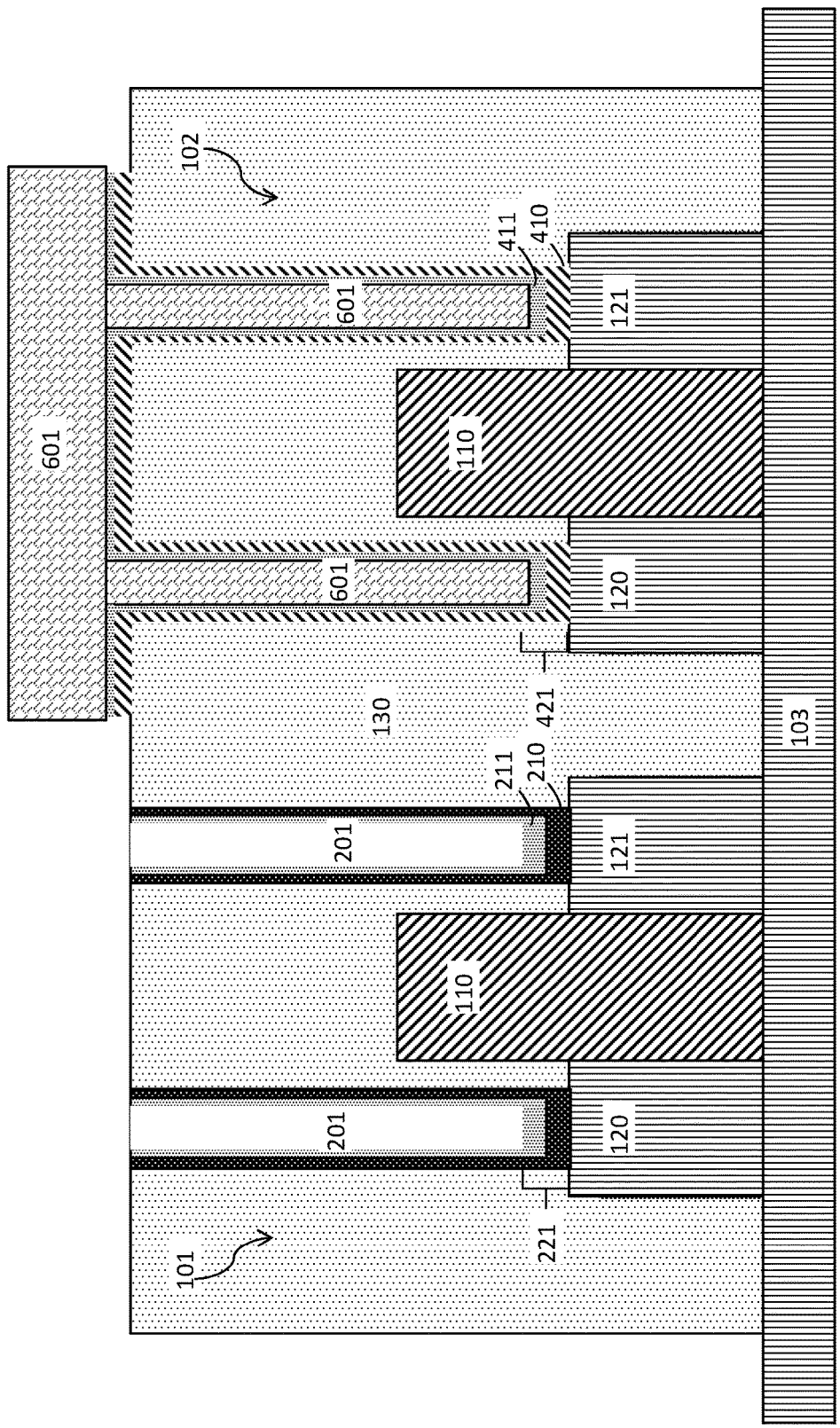
Figure 6B:
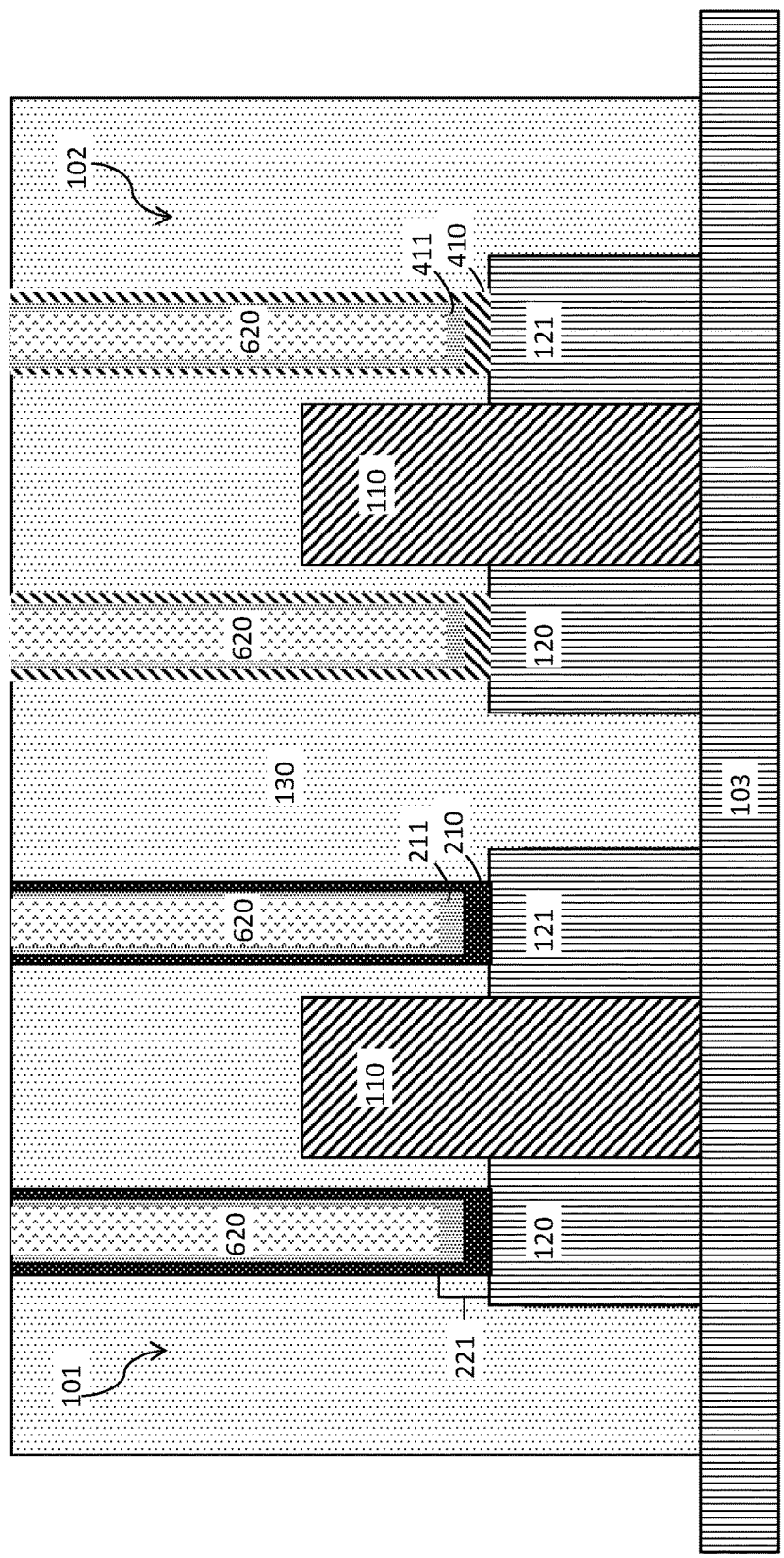

FIGS. 6A-6B illustrate an exemplary method of making a semiconductor device according to a second embodiment of the present invention and follow FIG. 4A. FIG. 6A is a cross-sectional side view after disposing a (second) mask 601 over the PFET 102 and removing the sacrificial material 220 from the NFET 101. Although the first embodiment shown in FIGS. 1-5B use a single mask 301 (as shown in FIG. 3B), the second embodiment uses a second mask 601. The mask 601 blocks the PFET 102 region (over the second transistor). The mask 601 covers at least the contact trenches 201 over the source and drain regions 120, 121 of the PFET 102. The mask 601 may include, for example, a hard mask material or a photoresist material. Non-limiting examples of suitable materials for the hard mask materials include silicon oxide, silicon nitride, or any combination thereof.

The material forming the second liner 421 remaining over the ILD layer 130 as shown in FIG. 4A in the NFET 101 region is stripped away, along with the sacrificial material 220 within the contact trenches 201. The sacrificial material 220 may be removed from the NFET 101 (first transistor) contact trenches 201 by a suitable stripping process. For example, the sacrificial material 220 may be removed by a dry etching process, for example, ashing. Ashing is performed using a suitable reaction gas, for example, $O_2$, $N_2$, $H_2/N_2$, $O_3$, $CF_4$, or any combination thereof. The dry etching may be combined with a wet etching process. The wet etching process may be performed, for example, with a suitable wet etchant, such as sulfuric acid and hydrogen peroxide.

FIG. 6B is a cross-sectional side view after removing the second mask 601, filling both transistors (NFET 101 and PFET 102) contact trenches 201 with a contact metal 620, and performing a planarization process. Non-limiting examples of suitable contact metals 620 include aluminum, platinum, gold, tungsten, titanium, or any combination thereof. The contact metal 620 may be deposited by a known deposition process, for example, CVD, PECVD, PVD, plating, thermal or e-beam evaporation, and sputtering. A planarization process, for example, CMP, is performed to polish the surface of the ILD layer 130. The contact metals 620 filling the two transistors (NFET 101 and the PFET 102) may be the same or different.

As described above, embodiments of the present invention provide methods of making semiconductor devices with different contact liners. The inventive process flow optimizes the vertical metal contact resistance. Embodiments of the inventive device structure and methods provide reduced contact resistance in semiconductor devices.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating features of a semiconductor device, the method comprising:
   filling a first trench contact of a first transistor and a second trench contact of a second transistor with a sacrificial material;
   disposing a first mask over the first trench contact;
   removing the sacrificial material and a first liner material from the second trench contact;
   removing the first mask and depositing a second liner material within the second trench contact and over the first trench contact; and
   disposing a second mask over the second trench contact and removing the second liner material and the sacrificial material from the first trench contact.

2. The method of claim 1, wherein the sacrificial material is amorphous carbon.

3. The method of claim 1, wherein the first liner material comprises a bilayer of different materials.

4. The method of claim 1, wherein the second liner material comprises a bilayer of different materials.

5. The method of claim 1, wherein both the first liner material and the second liner material comprise a bilayer of different materials.

6. The method of claim 1, wherein the first liner material is titanium, titanium nitride, or a combination thereof.

7. The method of claim 1, wherein the second liner material is cobalt, titanium, titanium nitride, cobalt titanium, nickel, platinum, nickel platinum titanium, or any combination thereof.

8. The method of claim 1, wherein the first transistor is an NFET.

9. The method of claim 1, wherein the second transistor is a PFET.

10. The method of claim 1, wherein the sacrificial material is deposited by a chemical vapor deposition process.

11. A method of fabricating features of a semiconductor device, the method comprising:
    filling a first trench contact of an NFET and a second trench contact of a PFET with a sacrificial material;
    disposing a first mask over the first trench contact;
    removing the sacrificial material and a first liner material from the second trench contact;
    removing the first mask and depositing a second liner material within the second trench contact and over the first trench contact; and
    disposing a second mask over the second trench contact and removing the second liner material and the sacrificial material from the first trench contact.

12. The method of claim 11, wherein the sacrificial material is amorphous carbon.

13. The method of claim 11, wherein the first liner material comprises a bilayer of different materials.

14. The method of claim 11, wherein the second liner material comprises a bilayer of different materials.

15. The method of claim 11, wherein both the first liner material and the second liner material comprise a bilayer of different materials.

16. The method of claim 11, wherein the first liner material is titanium, titanium nitride, or a combination thereof.

17. The method of claim 11, wherein the second liner material is cobalt, titanium, titanium nitride, cobalt titanium, nickel, platinum, nickel platinum titanium, or any combination thereof.

18. The method of claim 1, wherein the first liner material comprises a metal nitride.

19. The method of claim 1, wherein the first liner material comprises a bilayer comprising a metal nitride.

20. The method of claim 1, wherein the sacrificial material is deposited by a chemical vapor deposition process.

* * * * *